(12) United States Patent
Kawai

(10) Patent No.: US 9,005,736 B2
(45) Date of Patent: Apr. 14, 2015

(54) ELECTRONIC COMPONENT MANUFACTURING METHOD

(75) Inventor: Hidemasa Kawai, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/517,623

(22) Filed: Jun. 14, 2012

(65) Prior Publication Data

US 2012/0251791 A1    Oct. 4, 2012

Related U.S. Application Data

(63) Continuation of application No. PCT/JP2010/072132, filed on Dec. 9, 2010.

(30) Foreign Application Priority Data

Dec. 24, 2009   (JP) .................................. 2009-291903

(51) Int. Cl.
*H01L 21/02*      (2006.01)
*H01L 23/02*      (2006.01)
(Continued)

(52) U.S. Cl.
CPC .............. *H01L 23/3121* (2013.01); *B32B 3/30* (2013.01); *H01L 21/56* (2013.01); *H01L 21/67092* (2013.01); *H01L 23/24* (2013.01); *H01L 23/562* (2013.01); *H01L 24/97* (2013.01); *H01L 2224/16225* (2013.01); *H01L 2924/01004* (2013.01); *H01L 2924/1815* (2013.01); *H01L 2924/19105* (2013.01); *H01L 2924/01005* (2013.01); *H01L 2924/01006* (2013.01);
(Continued)

(58) Field of Classification Search
CPC ............ B32B 3/00; B32B 3/30; H01L 23/28; H01L 23/3121; H01L 23/562; H01L 27/00; H01L 2224/16225
USPC .......... 428/167, 172, 901, 212; 257/241, 244, 257/622, 787, 594, 678, 634, 704
See application file for complete search history.

(56) References Cited

U.S. PATENT DOCUMENTS 3,542,266 A * 11/1970 Woelfle ............................. 225/2
5,175,044 A * 12/1992 Arasawa ........................ 428/167
(Continued)

FOREIGN PATENT DOCUMENTS

CN          101794716 A     8/2010
JP          05-083001 A     4/1993
(Continued)

OTHER PUBLICATIONS

Official Communication issued in International Patent Application No. PCT/JP2010/072132, mailed on Feb. 1, 2011.
(Continued)

*Primary Examiner* — Donald J Loney
(74) *Attorney, Agent, or Firm* — Keating & Bennett, LLP

(57) ABSTRACT

An electronic component manufacturing method that efficiently grinds a cover layer provided on a substrate even when the substrate is warped includes the step of forming first grooves at intervals in a cover layer provided on a substrate by repeating grinding with a rotary blade at a pitch more than a thickness W of the rotary blade. Next, at least portions provided in the cover layer along the first grooves are removed to reduce the thickness of the cover layer by repeating grinding at a pitch equal to or less than the thickness W of the rotary blade.

3 Claims, 11 Drawing Sheets

(51) Int. Cl.

| | |
|---|---|
| *H01L 23/12* | (2006.01) |
| *H01L 23/28* | (2006.01) |
| *H01L 23/58* | (2006.01) |
| *B32B 3/30* | (2006.01) |
| *H01L 23/31* | (2006.01) |
| *H01L 21/56* | (2006.01) |
| *H01L 23/24* | (2006.01) |
| *H01L 23/00* | (2006.01) |
| *B24B 19/02* | (2006.01) |
| *B24B 7/22* | (2006.01) |
| *H01L 21/67* | (2006.01) |

(52) U.S. Cl.
CPC ......... *H01L2924/01033* (2013.01); *H01L 2924/01074* (2013.01); *B24B 19/028* (2013.01); *B24B 7/228* (2013.01)

(56) References Cited

U.S. PATENT DOCUMENTS

| | | | | |
|---|---|---|---|---|
| 5,600,101 | A * | 2/1997 | Sakai | 174/261 |
| 5,635,670 | A * | 6/1997 | Kubota et al. | 174/524 |
| 6,080,602 | A | 6/2000 | Tani et al. | |
| 6,211,771 | B1 * | 4/2001 | Zhang et al. | 338/22 R |
| 6,276,995 | B1 * | 8/2001 | Matsuta et al. | 451/41 |
| 6,286,499 | B1 | 9/2001 | Yoshii et al. | |
| 6,403,449 | B1 | 6/2002 | Ball | |
| 6,498,075 | B1 | 12/2002 | Fujimoto et al. | |
| 6,621,147 | B2 * | 9/2003 | Ball | 257/622 |
| 7,446,022 | B2 * | 11/2008 | Yoshikawa et al. | 438/463 |
| 2005/0012227 | A1 * | 1/2005 | Bolken | 257/787 |
| 2006/0022766 | A1 | 2/2006 | Ishigaki et al. | |
| 2007/0132112 | A1 * | 6/2007 | Ozaki et al. | 257/787 |
| 2009/0179304 | A1 * | 7/2009 | Takata | 257/620 |
| 2009/0255103 | A1 | 10/2009 | Hasegawa | |
| 2010/0187675 | A1 | 7/2010 | Shimizu et al. | |

FOREIGN PATENT DOCUMENTS

| | | |
|---|---|---|
| JP | 8-46091 A | 2/1996 |
| JP | 11-186301 A | 7/1999 |
| JP | 2000-124161 A | 4/2000 |
| JP | 2002-134661 A | 5/2002 |
| JP | 2002-343817 A | 11/2002 |
| JP | 2003-218144 A | 7/2003 |
| JP | 2005-161695 A | 6/2005 |
| JP | 3143888 U | 7/2008 |

OTHER PUBLICATIONS

Official Communication issued in corresponding Japanese Patent Application No. 2011-547463 mailed on Aug. 7, 2014.
Official Communication issued in corresponding Chinese Patent Application No. 201080059367.0, mailed on Apr. 10, 2014.
Official Communication issued in corresponding Japanese Patent Application No. 2011-547463, mailed on Apr. 1, 2014.
Official Communication issued in corresponding Chinese Patent Application No. 201080059367.0, mailed on Dec. 22, 2014.

* cited by examiner

FIG. 5A
FIG. 5B
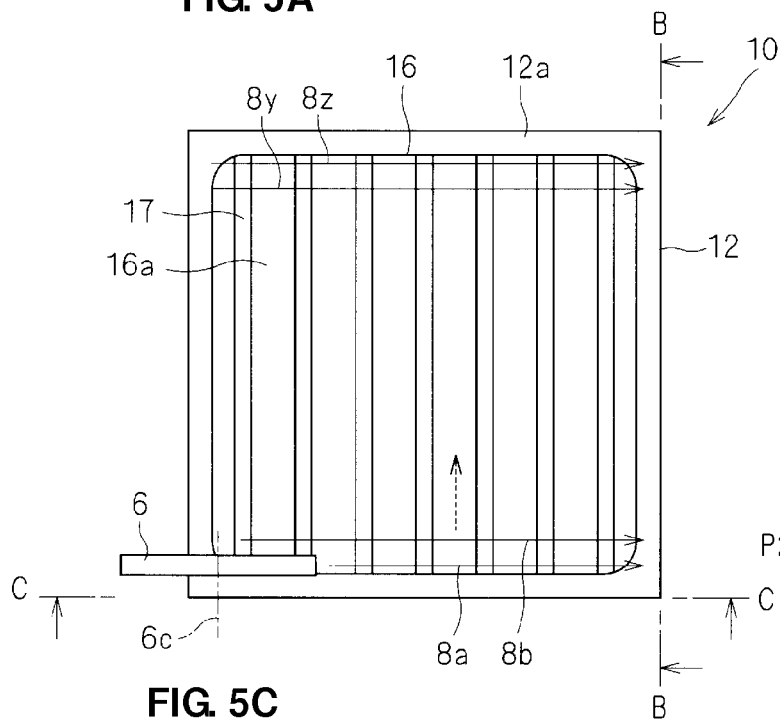
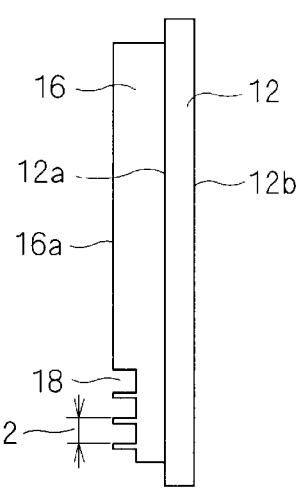
FIG. 5C
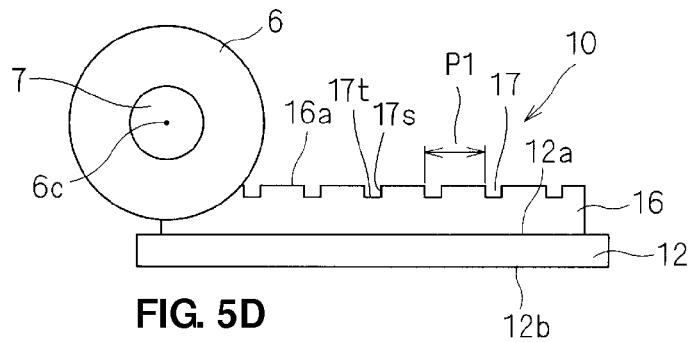
FIG. 5D
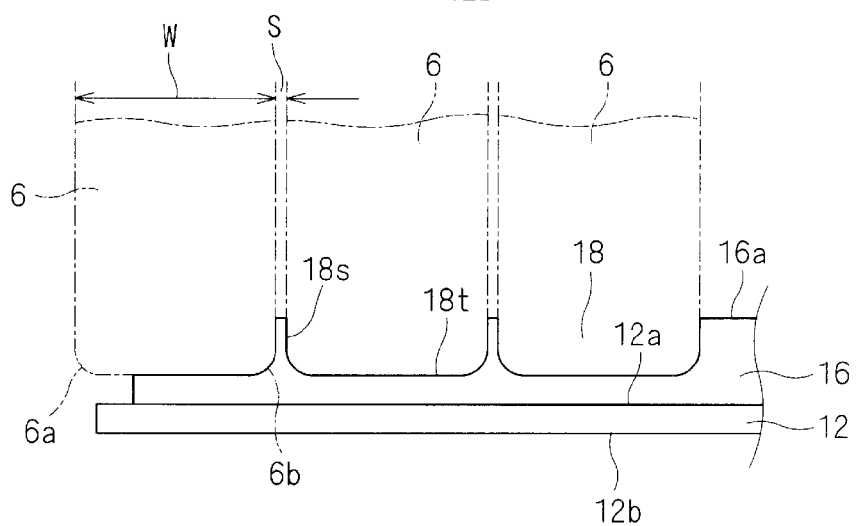

ELECTRONIC COMPONENT MANUFACTURING METHOD

BACKGROUND OF THE INVENTION

1. Field of the Invention

The present invention relates to an electronic component manufacturing method, and more specifically, to a manufacturing method for an electronic component in which a cover layer formed of resin or the like is provided on a substrate.

2. Description of the Related Art

An electronic component in which a cover layer is provided on a substrate has been proposed. For example, such an electronic component is produced through steps illustrated in cross-sectional views of FIGS. 14A-14E.

That is, semiconductor chips 139 are mounted on a substrate 130, and resin 152 in a liquid form is dropped from a dispenser 151 and is then cured to cover the semiconductor chips 139. Since the height of a surface of the resin 152 sometimes differs between the center and the periphery or is not equal to a predetermined height, the surface of the resin 152 is ground with a dicing blade 154 so that the height of the surface of the resin 152 becomes uniform, and division into individual electronic components is performed by the dicing blade 154.

When a cover layer is formed on a substrate, the substrate sometimes warps. For example, as illustrated in a cross-sectional view of FIG. 13A, when resin is dropped into an area surrounded by a frame-shaped member 15 placed on the outer periphery of an upper surface 12a of a substrate 12 and is then cured to form a cover layer 16, as illustrated in a cross-sectional view of FIG. 13B, internal stress in a direction of arrow 16k remains in the cover layer 16, and this sometimes warps the substrate 12.

If the surface of the cover layer is ground with a dicing blade in a state in which the substrate remains warped, the height (thickness) of the cover layer with respect to the substrate varies in the substrate direction after grinding, and divided electronic components become uneven in height. If the grinding depth is decreased to ensure a predetermined thickness of the cover layer in all divided electronic components, the divided electronic components include a defective component having an excessive thickness of resin, and this sometimes decreases yield. In contrast, if the grinding depth is increased so that the divided electronic components have thicknesses within a predetermined thickness, failure occurs, for example, mounted components in the resin are exposed or ground.

To handle a resin layer in an electronic component with a suction nozzle, a ground surface of the cover layer needs to be flat. If the cover layer is ground, for that purpose, at a pitch less than the thickness of the dicing blade so that an unground portion does not remain, the dicing blade is prone to uneven wear, and the life of the dicing blade is shortened.

That is, as shown by arrows 7a, 7b, . . . , 7y, and 7z in a plan view of FIG. 10A, a cover layer 16 formed on a substrate 12 is sequentially ground at a predetermined pitch while moving a rotary blade 6 relative to the cover layer 16.

At this time, since end portions 6a and 6b of an outer peripheral surface of a typical dicing blade 6 are chamfered to prevent chipping, as illustrated in an enlarged side view of FIG. 12, if grinding is performed at a pitch equal to the thickness of the dicing blade 6, unground portions 16y remain.

If grinding is performed at a pitch less than the thickness of the rotary blade 6, only one side (right side in the figure) of the outer peripheral surface of the rotary blade 6 performs grinding, and the rotary blade 6 is prone to uneven wear, as illustrated in FIGS. 10B and 10C serving as enlarged side views along line A-A in FIG. 10A.

If grinding is continued with the unevenly worn rotary blade 6, unground portions 16z are formed on the ground surface, as illustrated in an enlarged cross-sectional view of FIG. 1, and therefore, it is necessary to replace the dicing blade. This shortens the life of the dicing blade.

SUMMARY OF THE INVENTION

In view of the above-described circumstances, preferred embodiments of the present invention provide an electronic component manufacturing method that can efficiently grind a cover layer located on a substrate even when the substrate is warped.

According to a preferred embodiment of the present invention, an electronic component manufacturing method produces electronic components by dividing a collective substrate in which a cover layer is provided on a substrate. The electronic component manufacturing method includes (a) a first preliminary grinding step of forming with a rotary blade, in the cover layer, a plurality of first grooves extending in a first direction and spaced in a direction perpendicular or substantially perpendicular to the first direction by repeating a grinding operation of removing the cover layer while rotating the rotary blade at a pitch more than a width of the rotary blade and moving the rotary blade relative to the collective substrate and along the collective substrate in a direction perpendicular or substantially perpendicular to a rotation center axis of the rotary blade in a state in which the rotary blade bites in the cover layer of the collective substrate, and (b) a main grinding step of removing at least portions of the cover layer along side surfaces of the first grooves to reduce the thickness of the cover layer by repeating the grinding operation with the rotary blade in a second direction different from the first direction at a pitch equal to or less than the width of the rotary blade after the first preliminary grinding step.

According to the above method, a warp of the substrate can be significantly reduced by forming the first grooves in the cover layer that causes the warp of the substrate in the first preliminary grinding step. Since the first grooves are spaced, the rotary blade does not wear unevenly. In the main grinding step, the cover layer can be ground in a state in which the warp of the collective substrate is reduced, and therefore, unevenness in height (thickness) of the cover layer with respect to the substrate can be reduced.

When the cover layer is ground at the pitch less than the thickness of the rotary blade, the first grooves have been formed in the cover layer. Hence, the amount of grinding of the cover layer at the pitch less than the thickness of the rotary blade is smaller than in a case in which the cover layer is ground at the pitch less than the thickness of the rotary blade from the beginning. This lengthens the life of the rotary blade, and can stably obtain a flat ground surface with few irregularities even through long-time grinding.

Preferably, the electronic component manufacturing method further includes, after the first preliminary grinding step and before the main grinding step, a second preliminary grinding step of forming, in the cover layer, a plurality of second grooves extending in a third direction different from the first direction and the second direction or in the second direction and spaced in a direction perpendicular or substantially perpendicular to the third direction or the second direction by repeating the grinding operation with the rotary blade in the third direction or the second direction at a pitch more than the width of the rotary blade.

In this case, the first grooves may extend in the second direction or may extend in the third direction different from the first direction and the second direction. By the second preliminary grinding step, a warp of the substrate in a direction different from the direction of the warp of the substrate reduced by the first preliminary grinding step can be reduced further. For this reason, unevenness in height (thickness) of the cover layer with respect to the substrate after the main grinding step can be reduced further.

Preferably, an outer peripheral end of the rotary blade is chamfered. In the main grinding step, the grinding operation is repeated with the rotary blade in the second direction at a pitch equal to or less than a length in a direction of the rotation axis of an outer peripheral surface of the rotary blade other than the chamfered outer peripheral end.

In this case, since an unground portion is not formed on the cover layer along the chamfer of the rotary blade in the main grinding step, the ground surface of the cover layer can be entirely flat. Moreover, uneven wear of the rotary blade can be suppressed.

Preferably, the pitch of the grinding operation decreases as the step is later in order.

In this case, by gradually decreasing the grinding pitch, the warp of the substrate can be reduced, and unevenness in height (thickness) of the cover layer with respect to the substrate can be reduced. Hence, thinner electronic components can be produced from the collective substrate.

Preferably, the substrate is a laminated body formed by alternately stacking an insulator and a conductor.

Since the substrate in which the insulator is a resin or ceramic material is apt to warp when the cover layer is formed, great effects can be obtained by various preferred embodiments of the present invention.

According to another preferred embodiment of the present invention, an electronic component includes a cover layer provided on a substrate. The electronic component includes, in a surface of the cover layer, a recess extending in a first direction and a recess extending in a second direction different from the first direction.

According to the above structure, stress occurring in the first direction of the recess and stress occurring in the second direction of the recess can be significantly reduced, and a total stress of the cover layer can be more effectively reduced than in a case in which a recess is provided only in one direction.

Preferably, the first direction and the second direction are perpendicular or substantially perpendicular to each other.

In this case, stresses occurring in the short-side direction and the long-side direction of the electronic component can be reduced and a warp of the electronic component can be reduced by making the recesses perpendicular or substantially perpendicular to each other, and therefore, mountability is enhanced. Further, although heat radiation is necessary when a heat generating component, such as a power amplifier, is mounted on the substrate, heat radiation performance can be enhanced by forming irregularities on the surface of the cover layer that covers the power amplifier.

According to yet another preferred embodiment of the present invention, an electronic component is produced by the above-described manufacturing method.

According to a further preferred embodiment of the present invention, an electronic component grinding apparatus that is used in the above-described manufacturing method includes (a) a rotary-blade holding portion that holds the rotary blade, and (b) a base that is rotatable relative to the rotary-blade holding portion and holds the collective substrate.

According to various preferred embodiments of the present invention, even when the substrate is warped, the cover layer provided on the substrate can be efficiently ground. Further, since grinding can be performed so that the thickness of the substrate rarely varies, the thickness of the electronic component can be decreased.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 5A, 5B, 5C, and 5D are a plan view, a side view, a front view, and an enlarged side view, respectively, illustrating a second preliminary grinding step according to the first preferred embodiment of the present invention.

DETAILED DESCRIPTION OF THE PREFERRED EMBODIMENTS

Preferred embodiments of the present invention will be described below with reference to FIGS. 1 to 9C and FIGS. 13A and 13B.

First Preferred Embodiment

A manufacturing method for an electronic component 11 according to a first preferred embodiment will be described with reference to FIGS. 1 to 7 and FIGS. 13A and 13B.

Figure 1:
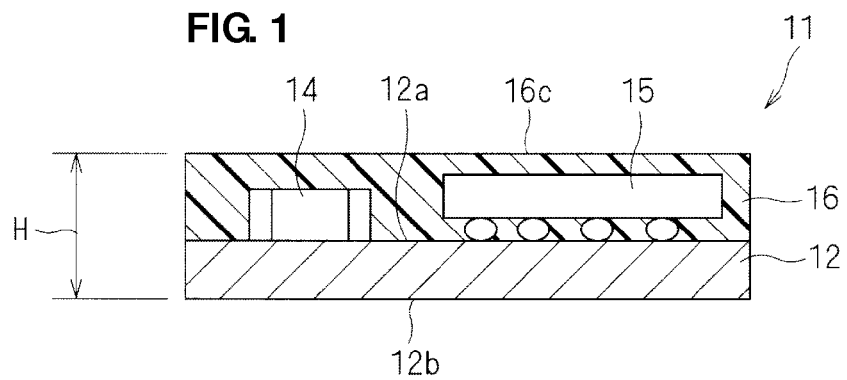
FIG. 1 is a cross-sectional view of an electronic component according to a first preferred embodiment of the present invention.

In the electronic component 11, as illustrated in a cross-sectional view of FIG. 1, a cover layer 16 is provided on an upper surface 12a of a substrate 12. An upper surface 16c of the cover layer 16 is ground flat. Components 14 and 15, such as a chip component and a semiconductor chip, are mounted on the upper surface 12a of the substrate 12, and the components 14 and 15 are covered with the cover layer 16.

For example, the substrate 12 is a laminated body formed preferably by alternately stacking an insulator and a conductor. The substrate 12 in which the insulator is a resin or ceramic material easily warps when the cover layer 16 formed of resin or the like is formed. For this reason, it is highly effective to perform main grinding after preliminary grinding, as will be described below.

The electronic component 11 is formed by dividing a collective substrate. That is, after a portion to define a plurality of electronic components 11 is formed on a common substrate 12, the portion is divided into individual electronic components 11.

Next, a manufacturing method for the electronic component 11 will be described with reference to FIGS. 2A to 6 and FIGS. 13A and 13B. The electronic component 11 is produced through the following steps (a) to (e).

(a) Formation of Collective Substrate

Figure 2A:
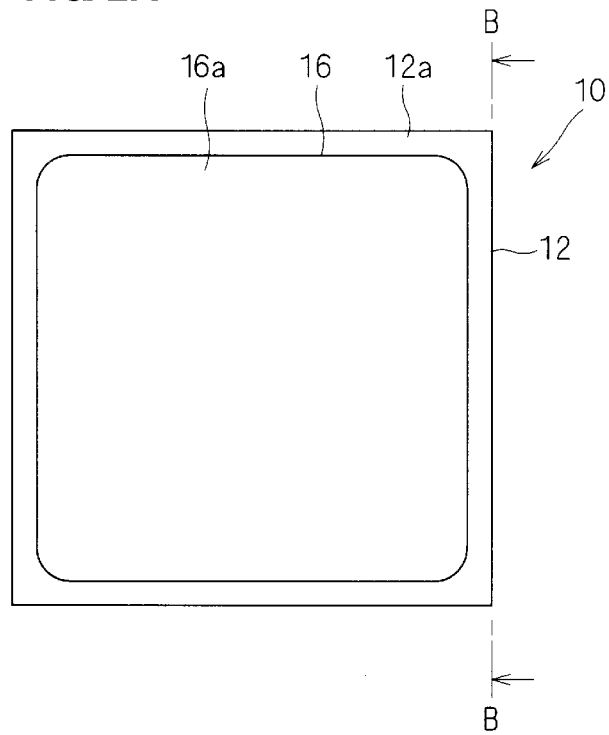
FIGS. 2A and 2B are a plan view and a side view, respectively, of a collective substrate according to the first preferred embodiment of the present invention.
Figure 2B:
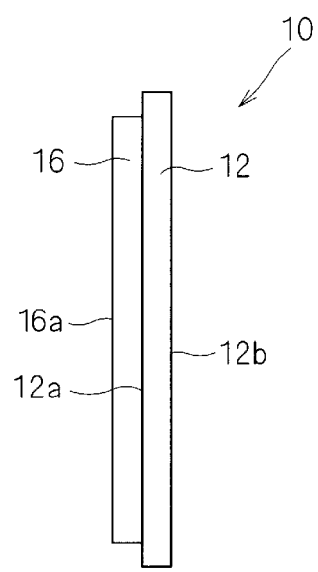

First, a collective substrate 10 illustrated in FIGS. 2A and 2B is formed. FIG. 2A is a plan view of the collective substrate 10. FIG. 2B is a side view along line B-B of FIG. 2A.

As illustrated in FIGS. 2A and 2B, unillustrated components are mounted on an upper surface 12a of a common substrate 12 to be formed into a plurality of electronic components, and a cover layer 16 is then formed to cover the components.

Figure 13A:
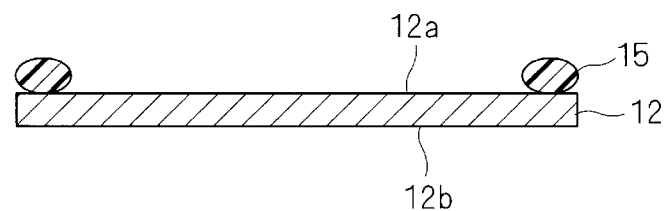
FIGS. 13A and 13B are cross-sectional view illustrating a step of forming a collective substrate.
Figure 13B:
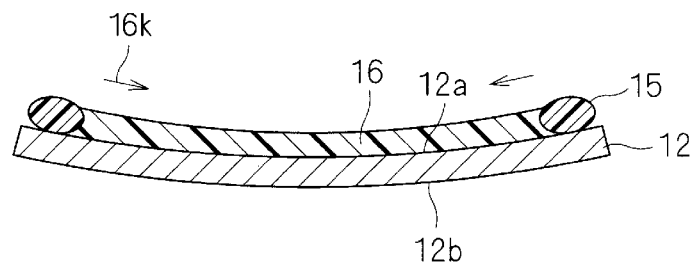
Figure 14A:
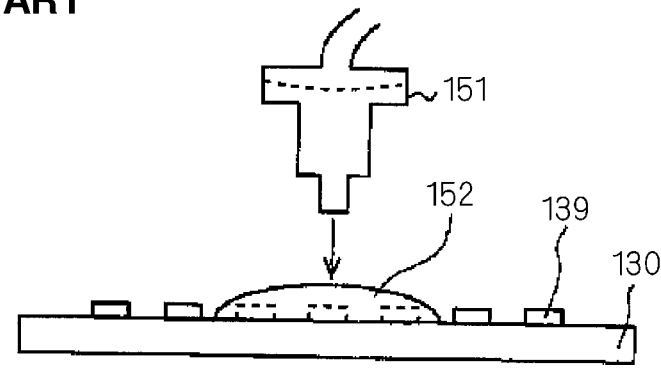
FIGS. 14A-14E are cross-sectional views illustrating a manufacturing process for an electronic component according to the related art.
Figure 14B:
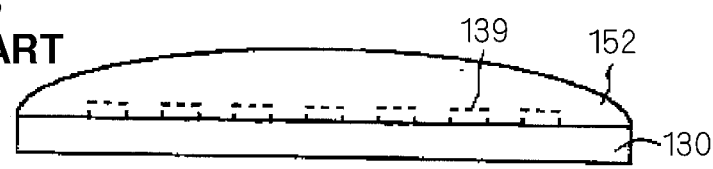
Figure 14C:
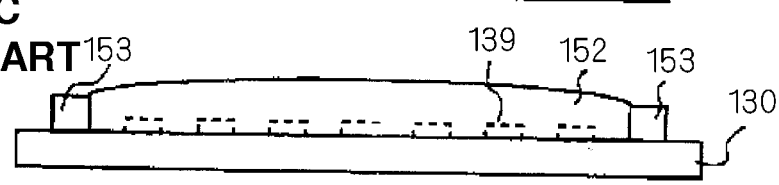
Figure 14D:
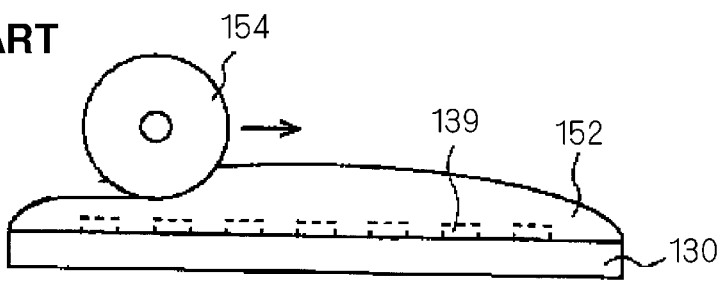
Figure 14E:

For example, after the unillustrated components are mounted on the upper surface 12a of the common substrate 12, as illustrated in a cross-sectional view of FIG. 13A, a frame-shaped member 15 formed of resin or the like is placed along the outer periphery of the substrate 12. Next, covering resin in a liquid form is dropped from a dispenser into an inner portion surrounded by the frame-shaped member 15. At this time, the frame-shaped member 15 prevents the covering resin from leaking out from the frame-shaped member 15. Next, the covering resin is thermally cured by being heated by an oven or the like to form a cover layer 16, as illustrated in a cross-sectional view of FIG. 13B. If internal stress in a direction of arrow 16k remains in the cover layer 16, the upper surface 12a warps in a concave form and a lower surface 12b warps in a convex form in the substrate 12.

(b) First Preliminary Grinding Step

Figure 3:
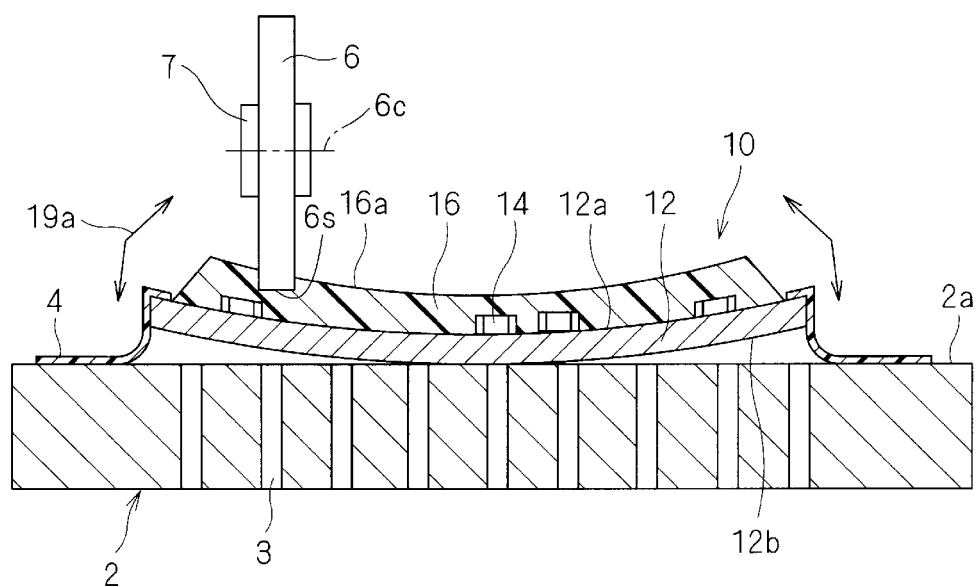
FIG. 3 is a cross-sectional view illustrating a first preliminary grinding step according to the first preferred embodiment of the present invention.
Figure 4:
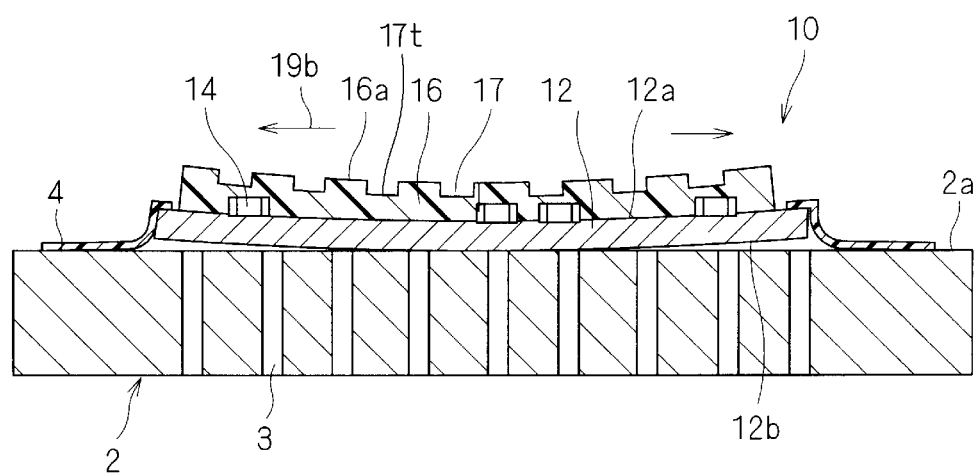
FIG. 4 is a cross-sectional view illustrating a state after the first preliminary grinding step according to the first preferred embodiment of the present invention.

Next, as illustrated in a cross-sectional view of FIG. 3, the collective substrate 10 is placed on an upper surface 2a of a base 2 of a grinding apparatus, and vacuuming is performed from suction holes 3 of the base 2, so that the collective substrate 10 is attracted and fixed to the base 2.

Particularly when the substrate 12 is greatly warped and is not sufficiently attracted by simply being placed on the base 2, for example, when the substrate 12 is a ceramic multilayer board, an edge portion of the substrate 12 is sealed with a tape 4 or the like to prevent air inflow from the outside.

Although not illustrated, in a state in which a frame-shaped holder is placed around the substrate 12 and the substrate 12 is held by the holder by attaching a dicing tape on the lower surface 12b of the substrate 12 and a lower surface of the holder, the dicing tape may be attracted onto the upper surface 2a of the base 2.

Then, a first preliminary grinding operation is performed in a state in which the collective substrate 10 is attracted and fixed to the base 2.

That is, an upper surface 16a of the cover layer 16 in the collective substrate 10 is ground with a rotary blade 6 that is held and rotated by a rotary-blade holding portion 7 of the grinding apparatus. Grinding is performed at a pitch more than a thickness of the rotary blade 6. Thus, as illustrated in a cross-sectional view of FIG. 4, first grooves 17 are formed in the cover layer 16 at intervals.

More specifically, the first grooves 17 are formed by moving the rotary-blade holding portion 7 along the base 2 in a direction perpendicular or substantially perpendicular to a rotation center axis 6c of the rotary blade 6 in a state in which the rotary blade 6 is being rotated and an outer peripheral surface 6s of the outer peripheral surface 6s bites in the cover layer 16 of the collective substrate 10. Formation of the first grooves 17 is repeated while shifting the position of the rotary-blade holding portion 7 relative to the base 2 at a pitch more than the thickness of the rotary blade 6 in a direction of the rotation center axis 6c of the rotary blade 6.

A dicing apparatus is preferably used as the grinding apparatus, and a dicing blade is used as the rotary blade 6. A special grinding apparatus and a special rotary blade may be used, for example.

In the substrate 12 that is warped before the first preliminary grinding operation as shown by arrow 19a in FIG. 3, when the first grooves 17 are formed in the cover layer 16, the internal stress in the cover layer 16 is reduced. For this reason, after the first preliminary grinding operation, the warp of the substrate 12 is reduced, as shown by arrow 19b in the cross-sectional view of FIG. 4.

Since grinding is performed at the pitch more than the thickness of the rotary blade 6 in the first preliminary grinding operation, the entire outer peripheral surface 6s of the rotary blade 6 uniformly bites in the cover layer 16. For this reason, the rotary blade 6 does not wear unevenly.

(c) Second Preliminary Grinding Operation

Next, after the rotary blade 6 is withdrawn upward and the base 2 is turned relative to the rotary blade 6, the rotary blade 6 is moved down closer to the base 2, and a second preliminary grinding operation is performed similarly to the first preliminary grinding operation, as illustrated in FIGS. 5A-5D, so that second grooves 18 are further formed in the cover layer 16 having the first grooves 17. The rotary blade 6 is moved by moving the rotary-blade holding portion 7 up and down.

FIG. 5A is a plan view schematically illustrating the second preliminary grinding operation. FIG. 5B is a side view along line B-B of FIG. 5A. FIG. 5C is a front view along line C-C of FIG. 5A. FIG. 5D is an enlarged side view along line B-B of FIG. 5A.

For example, after the base 2 is turned 90 degrees, grinding is sequentially performed at a predetermined pitch with the rotary blade 6, as shown by arrows 8a, 8b, . . . , 8y and 8z in FIG. 5A, so that the second grooves 18 intersecting the first grooves 17 at right angles are formed, as illustrated in FIG. 5B.

As illustrated in FIGS. 5B and 5D, the second preliminary grinding operation is performed at a grinding pitch more than the thickness of the rotary blade 6, similarly to the first preliminary grinding operation so that the second grooves 18 are formed in the cover layer 16 at intervals S.

However, the grinding pitch in the second preliminary grinding operation is preferably less than in the first preliminary grinding operation. That is, a pitch P2 of the second grooves 18 illustrated in FIG. 5B is preferably less than a pitch P1 of the first grooves 17 illustrated in FIG. 5C. By decreasing the grinding pitch, the warp of the substrate 12 can be reduced, and unevenness in height (thickness) of the cover layer 16 with respect to the substrate 12 can be reduced. Hence, it is possible to produce thinner electronic components from the collective substrate 10.

(d) Main Grinding

Figure 6A:
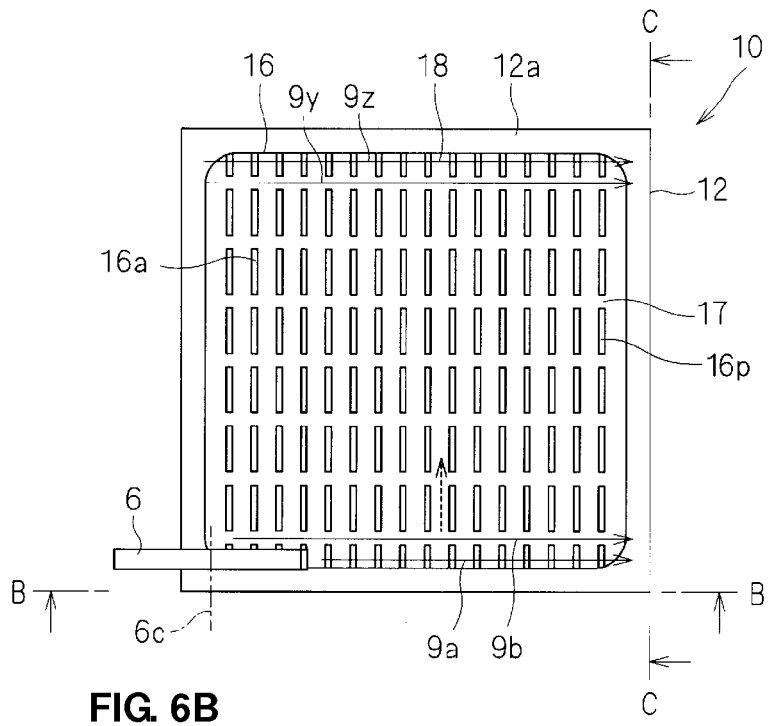
FIGS. 6A, 6B, and 6C are a plan view, a front view, and an enlarged side view, respectively, illustrating a main grinding step according to the first preferred embodiment of the present invention.
Figure 6B:
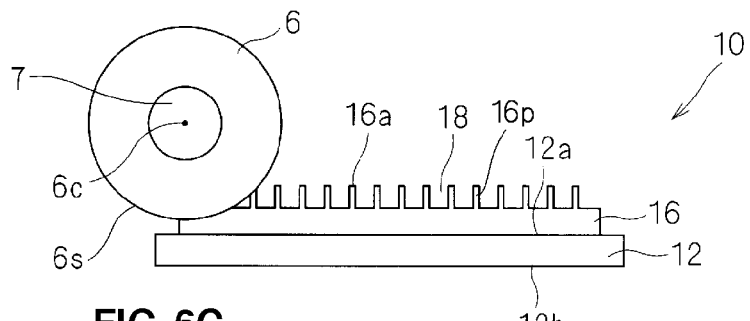
Figure 6C:
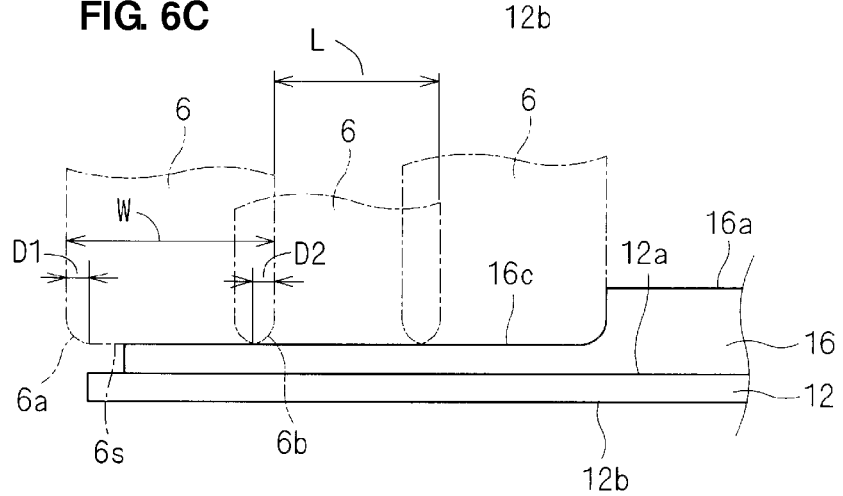
Figure 7:
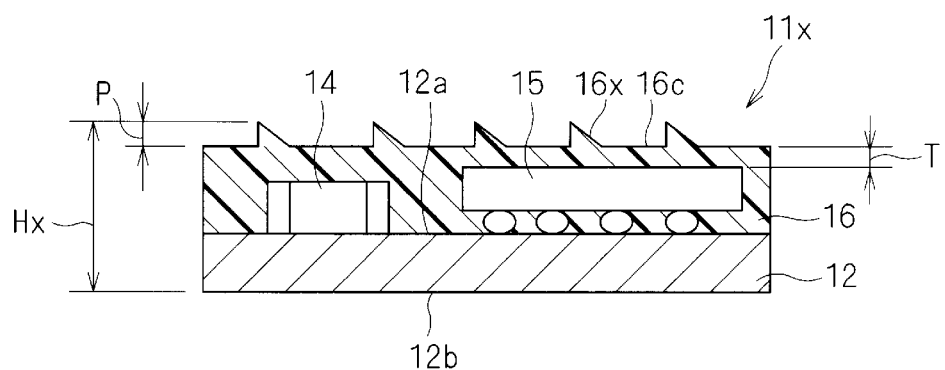
FIG. 7 is a cross-sectional view of an electronic component according to a comparative example.

Next, after the rotary blade 6 is withdrawn upward and the base 2 is turned relative to the rotary blade 6, the rotary blade 6 is moved down closer to the base 2, and main grinding is performed, as illustrated in FIG. 6A-6C, so that portions 16p that remain unground along the first grooves 17 and the second grooves 18 in the cover layer 16 are removed to form a flat upper surface 16c on the cover layer 16.

FIG. 6A is a plan view illustrating main grinding. FIG. 6B is a front view along line B-B of FIG. 6A. FIG. 6C is a side view along line C-C of FIG. 6A.

For example, after the base 2 is turned 90 degrees, grinding is sequentially performed at a predetermined pitch with the rotary blade 6, as shown by arrows 9a, 9b, . . . , 9y, and 9z in FIG. 6A.

The grinding pitch in the main grinding operation is less than in the second preliminary grinding operation. That is, as illustrated in FIG. 6C, in the main grinding operation, the grinding pitch is set to be equal to or less than the thickness of the rotary blade 6 so that portions remaining unground (unground portions) are not formed on the upper surface 16c of the cover layer 16 after the main grinding operation, unlike the first preliminary grinding operation and the second preliminary grinding operation.

When end portions 6a and 6b of the outer peripheral surface 6s of the rotary blade 6 are chamfered, the grinding pitch is set to be equal to or less than a length in the direction of the rotation center axis 6c of a portion of the outer peripheral surface 6s of the rotary blade 6 other than the end portions 6a and 6b. That is, as illustrated in FIG. 6C, the following condition is preferably satisfied:

$$L \leq W - (D1 + D2) \qquad (1)$$

where L represents the grinding pitch, W represents the thickness of the rotary blade 6, and D1 and D2 represent dimensions in the direction of the rotation center axis 6c of the chamfered end portions 6a and 6b of the rotary blade 6.

Figure 12:
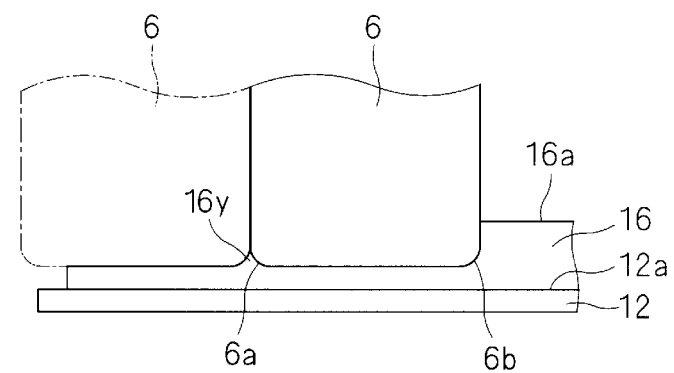
FIG. 12 is an enlarged side view illustrating a portion that remains unground.

Thus, portions that remain unground, such as unground portions 16y illustrated in FIG. 12, are not formed along the chamfered portions of the rotary blade 6. Hence, the upper surface 16c of the cover layer 16 can be entirely flattened.

In the main grinding operation, the entire upper surface 12a of the substrate 12 can be ground in consideration with reduction in a warp of the substrate 12 after the second preliminary grinding operation, and thinner electronic components can be produced from the collective substrate 10. That is, not only the portions along side surfaces 17s and 18s of the first and second grooves 17 and 18 (see FIGS. 5C and 5D) but also portions along bottom surfaces 17t and 18t of the first and second grooves 17 and 18 (see FIGS. 5C and 5D) can be removed from the cover layer 16. Hence, grinding (main grinding) can be performed so that the upper surface 16c of the cover layer 16 is entirely flat.

Since the main grinding operation is performed after the warp of the substrate 12 is reduced by the first preliminary grinding operation and the second preliminary grinding operation, unevenness in height (thickness) of the cover layer 16 with respect to the substrate 12 can be made smaller than in a case in which only main grinding is performed without performing preliminary grinding.

(e) Division

Next, the collective substrate 10 is divided into individual electronic components 11.

For example, the grinding apparatus used in preliminary grinding and main grinding is also used, and the cover layer 16 and the substrate 12 are completely cut and divided in the thickness direction by the rotary blade 6. In this case, a dicing apparatus can be used as the grinding apparatus and a dicing blade can be used as the rotary blade.

When the substrate 12 is a ceramic multilayer board, for example, break grooves may be formed in the substrate 12 by a laser or a dicing apparatus before components are mounted on the substrate 12, and the collective substrate 10 may be divided along the break grooves of the substrate 12 after main grinding. In this case, a special grinding apparatus and a special rotary blade can be used in preliminary grinding and main grinding.

When electronic components are produced through the above-described steps (a) to (e), since the upper surface 16c of the cover layer 16 can be flattened, the height of the electronic components 11 can be reduced. That is, if unground portions 16x remain on the cover layer 16, as illustrated in a cross-sectional view of FIG. 7, a height Hx of the electronic component 11 includes a predetermined thickness T of the cover layer 16 ensured on the component 15 and a height P of the unground portions 16x. Thus, the height Hx is increased by the height P. In contrast, when the upper surface 16c of the cover layer 16 is flat, as illustrated in FIG. 1, a height H of the electronic component 11 can be less than in the case in which the unground portions 16x remain on the upper surface 16c of the cover layer 16.

When main grinding is performed after preliminary grinding, the grinding amount in main grinding, which easily causes uneven wear in the rotary blade 6, is less than in a case in which main grinding is directly performed without performing preliminary grinding. Hence, the life of the rotary blade 6 is lengthened.

When the first grooves 17 and the second grooves 18 are formed, warps of the substrate 12 in two different directions can be reduced before main grinding. Therefore, unevenness in height (thickness) of the cover layer 16 with respect to the substrate 12 can be reduced after main grinding.

The grinding direction for the cover layer 16 may be (a) the same as the grinding direction for the first grooves 17, (b) the same as the grinding direction for the second grooves 18, or (c) different from both the grinding direction for the first grooves 17 and the grinding direction for the second grooves 18.

Alternatively, the first preliminary grinding operation and the second preliminary grinding operation may be performed so that the first grooves 17 and the second grooves 18 intersect diagonally.

In a state in which the first and second grooves 17 and 18 are formed in the collective substrate 10, the collective substrate 10 may be divided into electronic components without performing main grinding. In this case, stress occurring in the direction of the first grooves 17 and stress occurring in the direction of the second grooves 18 can be reduced, and the total stress of the cover layer 16 can be more effectively reduced than in a case in which grooves are formed only in one direction. When the first and second grooves 17 and 18 intersect at right angles, stresses occurring in a short-side direction and a long-side direction of the electronic components can be reduced, and a warp of the electronic components can be reduced. Hence, mountability of the electronic components is enhanced. Although heat radiation is required when a heat generating component, such as a power amplifier, is mounted on the substrate 12, heat radiation performance can be enhanced by forming irregularities on the surface of the cover layer 16 covering the power amplifier by the first and second grooves 17 and 18.

Second Preferred Embodiment

An electronic component manufacturing method according to a second preferred embodiment will be described with reference to FIGS. 8A-9C.

An electronic component manufacturing method of the second preferred embodiment preferably is almost the same as the electronic component manufacturing method of the first preferred embodiment. The second preferred embodiment preferably is different only in that preliminary grinding is performed only once in contrast to the first preferred embodiment in which preliminary grinding is performed twice, but is the same in other aspects. Hereinafter, the same constituents as those in the first preferred embodiment are denoted by the same reference numerals, and a description will be given with a focus on differences from the first preferred embodiment.

Figure 8A:
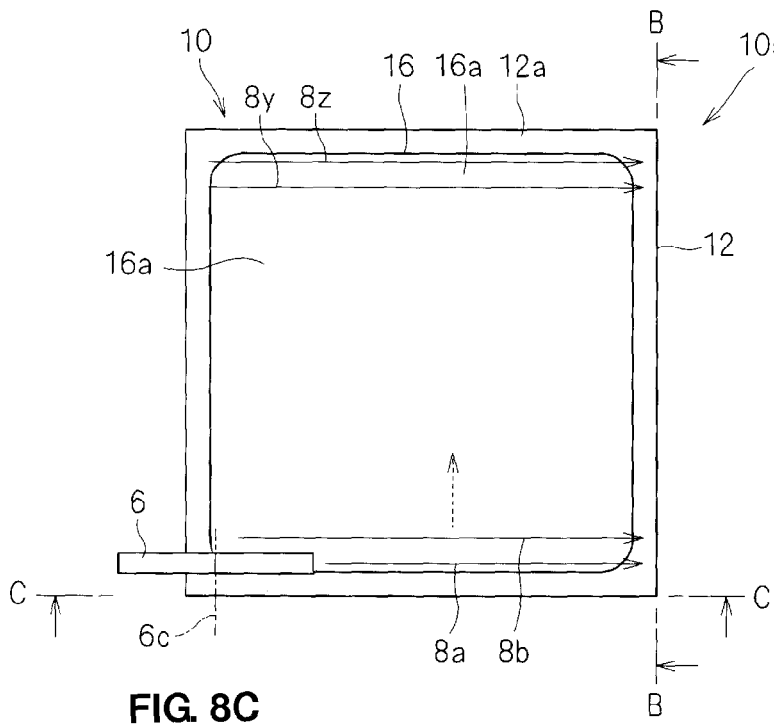
FIGS. 8A, 8B, 8C, and 8D are a plan view, a side view, a front view, and an enlarged side view, respectively, illustrating preliminary grinding according to a second preferred embodiment of the present invention.
Figure 8B:
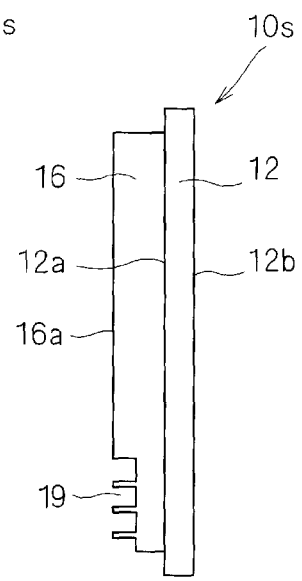
Figure 8C:
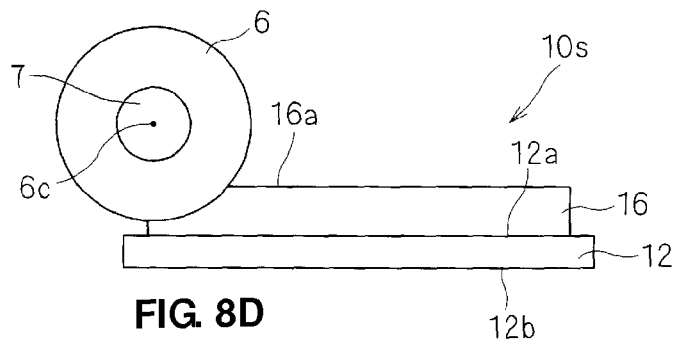
Figure 8D:
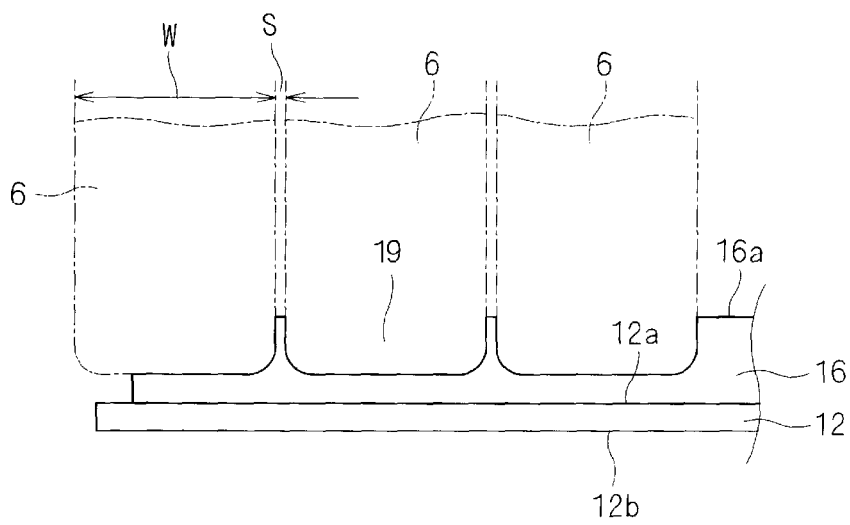

In the electronic component manufacturing method of the second preferred embodiment, preliminary grinding is performed only once, as illustrated in FIGS. 8A-8D. FIG. 8A is a plan view schematically illustrating preliminary grinding. FIG. 8B is a side view along line B-B of FIG. 8A. FIG. 8C is a front view along line C-C of FIG. 8A. FIG. 8D is an enlarged side view along line B-B of FIG. 8A.

As illustrated in FIGS. 8A-8D, preliminary grinding is performed similarly to the first preliminary grinding operation of the first preferred embodiment. That is, as shown by arrows 8a, 8b, . . . , 8y, and 8z, a cover layer 16 in a collective substrate 10 held on a base (not illustrated) of a grinding apparatus is sequentially ground with a rotary blade 6 at a pitch W+S more than a thickness W of the rotary blade 6, so that grooves 19 are formed in the cover layer 16 at intervals.

Next, after the rotary blade 6 is withdrawn upward and the base 2 is turned relative to the rotary blade 6, the rotary blade 6 is moved down closer to the base 2, and main grinding is performed, as illustrated in FIG. 9.

Figure 9A:
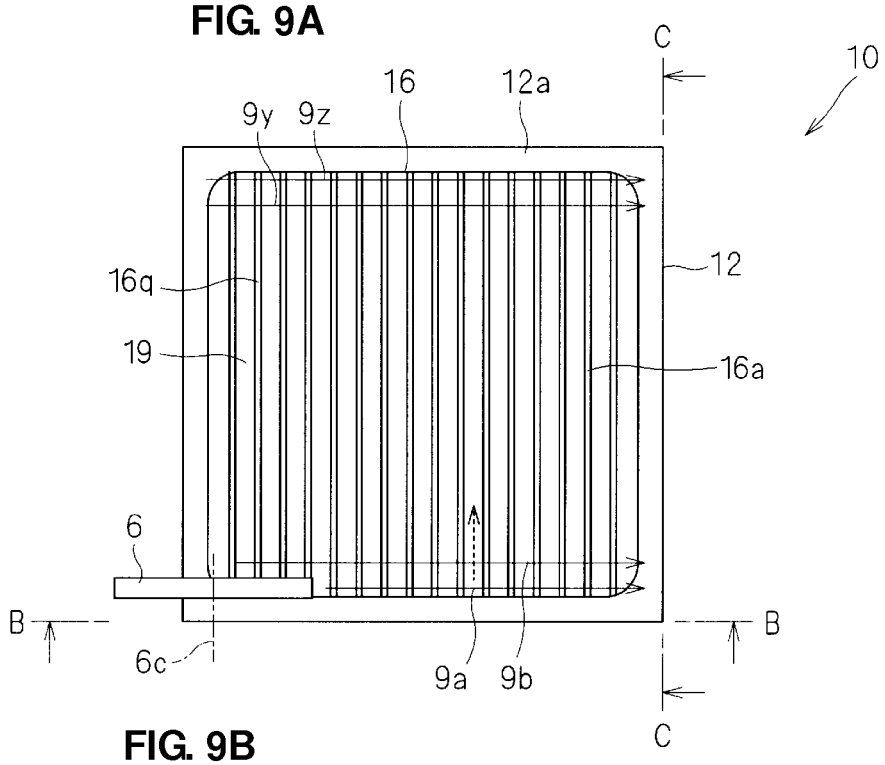
FIGS. 9A, 9B, and 9C are a plan view, a front view, and an enlarged side view, respectively, illustrating main grinding according to the second preferred embodiment of the present invention.
Figure 9B:
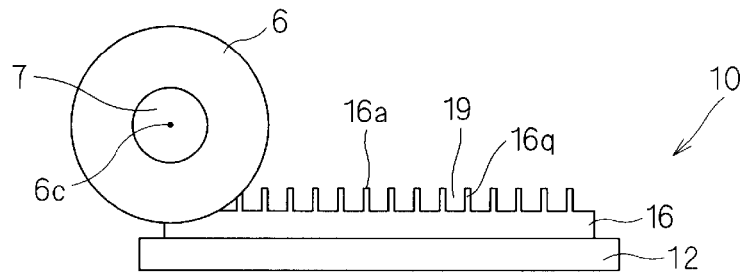
Figure 9C:
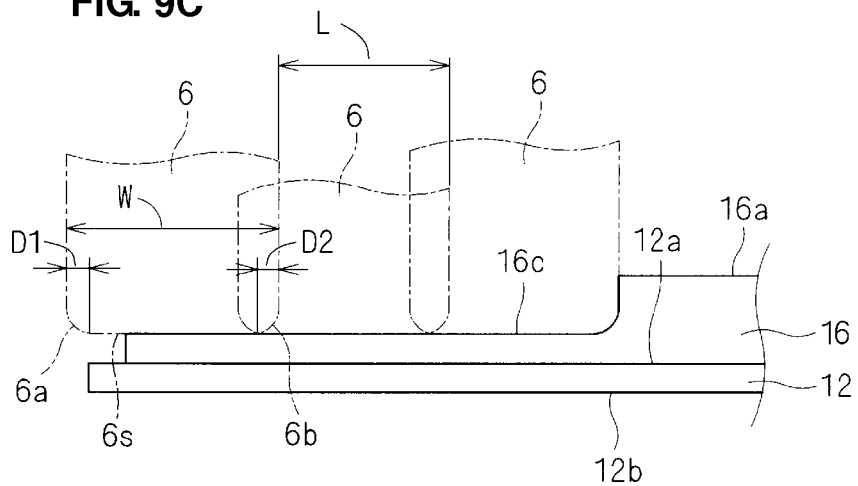
Figure 10A:
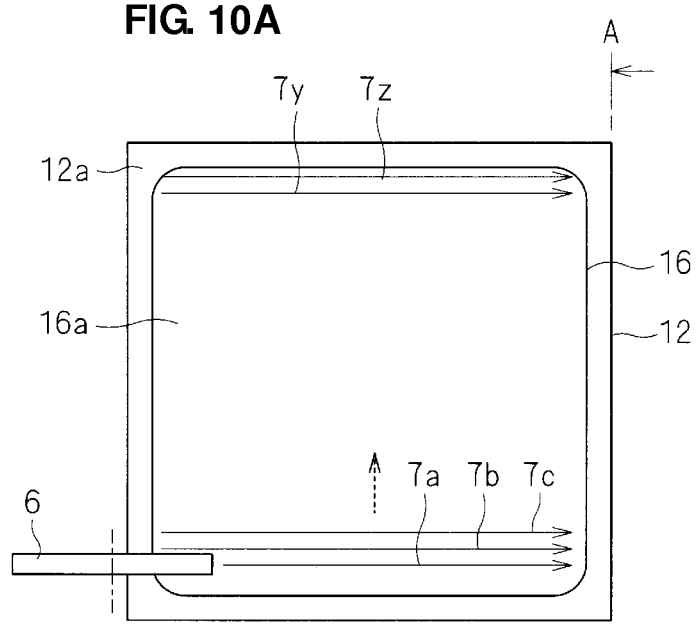
FIGS. 10A, 10B, and 10C are a plan view, an enlarged side view, and an enlarged side view, respectively, illustrating a grinding operation.
Figure 10B:
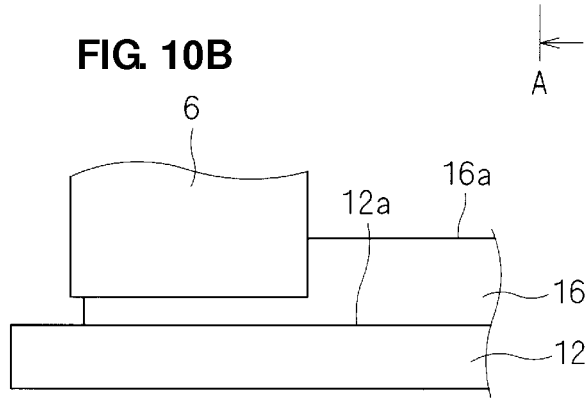
Figure 10C:
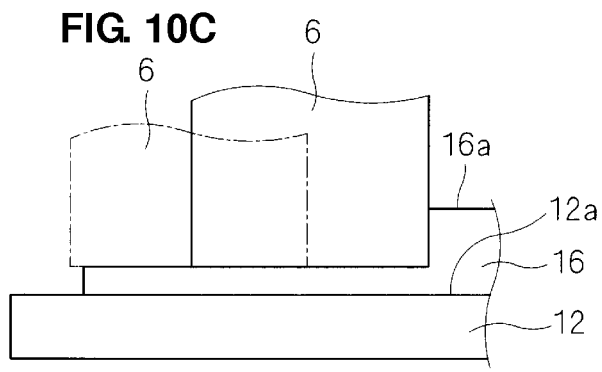
Figure 11A:
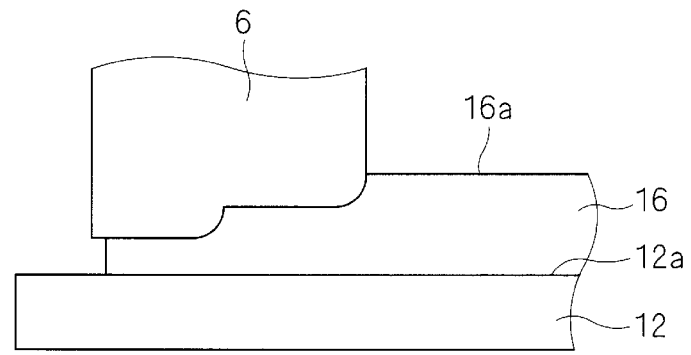
FIGS. 11A and 11B are enlarged side views illustrating uneven wear of a rotary blade.
Figure 11B:
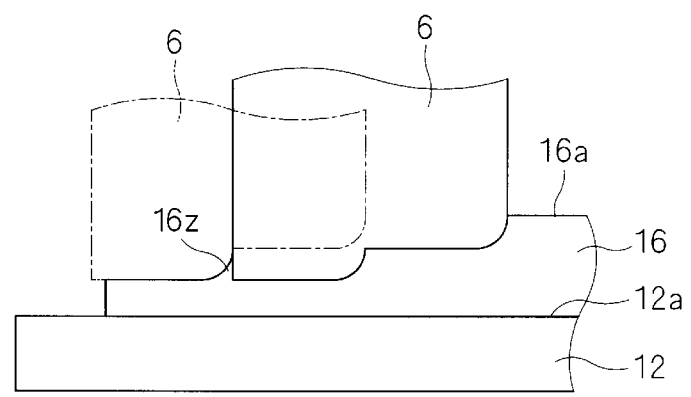

FIG. 9A is a plan view illustrating main grinding. FIG. 9B is a front view along line B-B of FIG. 9A. FIG. 9C is an enlarged side view along line C-C of FIG. 9A.

As illustrated in FIGS. 9A-9C, after the base 2 is turned 90 degrees, grinding is sequentially performed with the rotary blade 6 at a predetermined pitch, as shown by arrows 9a, 9b, . . . , 9y, and 9z to remove portions 16q that are not ground along the grooves 19 of the cover layer 16 in preliminary grinding, so that a flat upper surface 16c is formed on the cover layer 16.

As illustrated in FIG. 9C, the grinding pitch is set to be equal to or less than the thickness W of the rotary blade 6, and the entire upper surface 16c of the cover layer 16 after grinding is ground so that no portion remains unground.

When end portions 6a and 6b of an outer peripheral surface 6s of the rotary blade 6 are chamfered, the grinding pitch is set to be equal to or less than a length in a direction of a rotation center axis 6c of a portion of the outer peripheral surface 6s of the rotary blade 6 other than the chamfered end portions 6a and 6b. That is, the following condition is preferably satisfied:

$$L \leq W - (D1 + D2) \quad (2)$$

where L represents the grinding pitch, W represents the thickness of the rotary blade 6, and D1 and D2 represent dimensions in the direction of the rotation center axis 6c of the chamfered end portions 6a and 6b of the rotary blade 6.

By thus performing preliminary grinding a plurality of times while changing the angle of the base, the entire upper surface 12c of the substrate 12 can be ground in consideration of the warp of the substrate 12 after preliminary grinding.

By performing main grinding after preliminary grinding, as described above, the cover layer 16 formed on the substrate can be efficiently ground even when the substrate 12 is warped.

The present invention is not limited to the above-described preferred embodiments, but can be carried out with various modifications.

Instead of being continuously formed from one end to the other end of the peripheral edge of the cover layer, the first grooves and the second grooves may be formed partially. For example, when the substrate is greatly warped on the periphery, first grooves and second grooves may be formed only in a portion other than the center portion of the cover layer so as not to be formed in the center portion of the cover layer. That is, the first grooves (or the second grooves) may be formed at intervals in a direction in which the first grooves (or the second grooves) extend. When the periphery of the substrate is warped such that the center portion of the cover layer projects, the first grooves and the second grooves may be formed only in the center portion of the cover layer so as not to be formed in a portion of the cover layer other than the center portion.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   a substrate;
   a component mounted on the substrate; and
   a cover layer provided on the substrate and arranged to cover the component; wherein
   a surface of the cover layer includes a plurality of first recesses extending in a first direction and a plurality of second recesses extending in a second direction different from the first direction;
   no surface of the component is exposed to an outside of the surface of the cover layer;
   the plurality of first recesses are spaced apart from one another at a first pitch;
   the plurality of second recesses are spaced apart from one another at a second pitch that is smaller than the first pitch; and
   at least one of the plurality of first recesses and the plurality of second recesses is arranged directly above the component.

2. The electronic component according to claim 1, wherein the first direction and the second direction are perpendicular or substantially perpendicular to each other.

3. The electronic component according to claim 1, wherein the component is a chip component or a semiconductor chip.

* * * * *